(12) United States Patent
Beswick

(10) Patent No.: US 6,447,602 B1
(45) Date of Patent: Sep. 10, 2002

(54) CRYSTAL GROWTH APPARATUS AND METHOD

(75) Inventor: John A Beswick, Dera Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/674,775

(22) PCT Filed: Apr. 29, 1999

(86) PCT No.: PCT/GB99/01342
§ 371 (c)(1),
(2), (4) Date: Nov. 6, 2000

(87) PCT Pub. No.: WO99/58747
PCT Pub. Date: Nov. 18, 1999

(30) Foreign Application Priority Data

May 14, 1998 (GB) ............................................. 9810207

(51) Int. Cl.⁷ ............................................. C30B 15/20
(52) U.S. Cl. ........................... 117/18; 117/14; 117/200; 117/201; 117/202; 117/213
(58) Field of Search ............................. 117/14, 18, 200, 117/201, 202, 213

(56) References Cited

U.S. PATENT DOCUMENTS

| | | |
|---|---|---|
| 3,291,650 A | 12/1966 | Dohmen et al. |
| 3,740,563 A | 6/1973 | Reichard |
| 5,047,112 A | 9/1991 | Ciszek |
| 5,746,825 A * | 5/1998 | Von Ammon et al. ........ 117/14 |

FOREIGN PATENT DOCUMENTS

DE 195 29 485 2/1997
EP 0 610 830 8/1994

* cited by examiner

Primary Examiner—Felisa Hiteshew
(74) Attorney, Agent, or Firm—Nixon & Vanderhye P.C.

(57) ABSTRACT

Crystal growth apparatus comprising a crucible for containing a supply of molten material from which the crystal may be grown and first reflection means for receiving radiation directed along an input path and reflecting radiation towards second reflection means, whereby the second reflection means reflect output radiation along an output path. The first and second reflection means are arranged at or in close proximity with the surface of the molten material such that during crystal growth they maintain a substantially constant position relative to the surface of the molten material. The apparatus may comprise support means for supporting the first and second reflection means, whereby the support means are arranged to float on the molten material. The apparatus may be a single crucible apparatus or a double crucible apparatus. In the double crucible apparatus, the support means may be a second, inner crucible containing molten material in fluid communication with the molten material in the first crucible, whereby the inner crucible floats on the molten material in the first crucible and the first and second reflection means are supported on the inner crucible. The apparatus may also comprise image processing means for forming an image of the crystal or any part of the growth interface region and for determining crystal diameter measurement or meniscus diameter measurement during growth. The apparatus may also comprise means for controlling growth of the crystal in response to the measured crystal or meniscus region diameter. The invention also relates to a crucible for use in growing crystals and a crystal growth method.

24 Claims, 3 Drawing Sheets

CRYSTAL GROWTH APPARATUS AND METHOD

BACKGROUND OF THE INVENTION

1. Field of the Invention

The invention relates to crystal growth apparatus and a method of growing crystals. More particularly, the invention relates to apparatus and method for enabling automatic control of crystal diameter during crystal growth. The invention also relates to a crucible for use in growing crystals.

2. Discussion of the Prior Art

The growth of low defect single crystals has been the subject of considerable research in, for example, the semiconductor industry. Such crystals are an essential precursor in the fabrication of a vast variety of semiconductor devices.

The Czochralski seed-pulling technique for growing single crystals is well-known [e.g. Z. Physik. Chem. (Liebzig) 92, 219 (1918)]. By this technique the seed crystal is brought into contact with molten material (melt) to facilitate further crystallisation. The crystal so produced is drawn from the melt as it grows. The double crucible method for crystal growth has also been developed [e.g. Journal of Applied Physics, 29 no. 8 (1958) pp 1241–1244 and U.S. Pat. No. 5,047,112]. The apparatus typically comprises an outer crucible containing melt of the same composition as the crystal to be grown. An inner crucible floats on the melt in the outer crucible and a small channel through the bottom of the side wall of the inner crucible allows melt to flow in from the outer crucible.

More recently a modified double crucible method has been described (BG 9412629.9) in which an injector is used to allow molten material to enter the first crucible is formed from a material of higher thermal conductivity than the material used to form the second crucible. The injector is configured to provide relatively high thermal contact with the molten material in the first crucible and relatively low thermal contact with the material in the second crucible.

An important aspect of any crystal growth technique is the visualisation, measurement and control of the crystal diameter throughout the growth process. The most frequently used method for automatic diameter control is that of weighing the crystal or the crucible [e.g. H. J. A. van Dick et al., Acta Electronica 17 1 45–55 (1974). U.S. Pat. No. 2,908,004]. By this method, the rate of change of weight is measured and is used to calculate the crystal diameter. This technique does, however, have several disadvantages.

For some materials, the density of liquid is greater than that of the solid at the melting point. Therefore, if the temperature of the melt increases and the meniscus height increases correspondingly, the crystal weight appears to increase despite the reduction in diameter which occurs as a result of the increased temperature. The effect is to provide a control signal of the opposite sign to that required. This problem occurs for most of the group III–V semiconductors, including indium antimonide. Furthermore, the crystal is subject to a downward force due to surface tension, which is proportional to the cosine of the angle of contact relative to the vertical axis of the crystal. In some materials, including most of the group III–V semiconductors, the effective angle of contact of the liquid and the crystal is positive. For an increase in temperature, the meniscus diameter just below the crystal melt interface decreases and the effective angle of contact relative to the vertical axis of the crystal is reduced. The apparent weight due to the surface tension therefore increases and therefore gives a control signal of the opposite sign to that required by the reduction of diameter. These problems are addressed in GB 1494342 and GB 1465191.

Another problem with the weighing method of automatic crystal diameter control is that the differentiation effectively amplifies any noise in the weight signal. Therefore, at slow growth rates, when the differential weight signal is small the effect of noise in the weight signal is increased and the signal to noise ratio for the differential worsens. In practice, this means the method is of little use at growth rates of less than 2 millimeters/hour. Also, for the growth of larger crystals the weighing apparatus must have a greater capacity and thus, inevitably, a lower resolution. This makes the control of growth at small diameters less precise. In the case of encapsulated melts, the encapsulant exerts a buoyancy force which effectively reduces the weight of the crystal. For example, this effect varies depending on the encapsulant depth, crystal diameter and drainage of the encapsulant off the crystal.

X-ray imaging techniques have also been used for automatic crystal diameter control [e.g. H. J. A. van Dick et al., Acta Electronica 17 1 45–55 (1974), However, this techniques also has several disadvantages. There is a radiation hazard risk associated with X-rays and radiation protection costs can be expensive. Furthermore, the technique can be inconvenient due to the size of the equipment required and the need for it to be fitted around crystal growth apparatus. X-ray transparent windows are also required. The costs of such imaging apparatus are expensive.

Optical methods for visualising crystal growth have also been employed. Known optical techniques consist principally of two methods. One technique makes use of a light beam or beams reflected off the meniscus near to the growth interface. Movement of the meniscus and change of diameter is detected by changes in the angle of the reflected beam [e.g. e.g. H. J. A. van Dick et al., Acta Electronica 17 1 45–55 (1974), U.S. Pat. No. 3,201,650]. The second method makes use of a video image of the growing crystal to detect the meniscus and determine the diameter by image processing [e.g. D. F. O'Kane et al., Journal of Crystal Growth 13/14 624–628 (1972)]. However, these methods suffer from one or more of the following disadvantages. The apparent diameter of the crystal in the image is affected by changes of depth due to the falling melt level as the crystal grows and the melt is depleted. Also, if the crystal diameter is reduced significantly suddenly, the meniscus disappears from view under the growing crystal and measurement and control are lost. In the case of a liquid encapsulated melt, reflections from the encapsulant and its meniscus can cause confusion. As the melt level falls the view of the meniscus can be obscured by the crucible wall.

Changes in the melt depth during the growth process can be compensated by means of external pulling mechanism. However, this requires additional equipment and not all effects of the falling melt depth can be overcome. For example, it is not possible to overcome obstruction of the view of the meniscus by the crucible wall. It is an object of the present invention to overcome these problems.

In *Journal of Crystal Growth* 13/14 619–623 (1972) Gartner et al. describe a method of viewing in which observation of the growing crystal is made at an angle of less than 15° to the horizontal and against the bright meniscus. This method requires use of as large a crucible as possible and restricts growth to a melt fall of about 15 mm. Also, the crystal image has a dark background at the start of the growth process and a bright background later in the growth process. This background discontinuity may lead to complications and possible discontinuity of control. Also, the image of the growing crystal moves as the melt level falls and the image would move in a camera's view unless the camera or mirror were adjusted to compensate. The mirror also tends to suffer from deterioration in reflectivity due to vapour deposition as the growth process proceeds, with volatile materials resulting in poorer control.

SUMMARY OF THE INVENTION

It is an object of the present invention to provide a crystal growth apparatus and method which overcomes these problems.

According to the present invention, crystal growth apparatus comprises:

a crucible for containing a supply of molten material from which a crystal is grown, the molten material and the crystal have a meniscus region therebetween, and first reflection means for receiving radiation directed along an input path and reflecting radiation across a growth interface region and second reflection means for receiving radiation reflected across the growth interface region and reflecting output radiation along an output path, wherein the first and second reflection means are arranged at or in close proximity with the surface of the molten material such that during crystal growth they maintain a substantially constant position relative to the surface of the molten material.

The apparatus provides the advantage that an image of the crystal or any other part of the growth interface region, obtained by viewing output radiation reflected from the second reflection means, remains fixed in the field of view as the location of the first and second reflection means is independent of the fall in depth of the molten material which occurs as the crystal grows.

The apparatus may comprise support means for supporting the first and second reflection means, whereby the support means are arranged to float on the molten material such that during crystal growth the first and second reflection means maintain a substantially constant position relative to the surface of the molten material.

The support means may be integral with the first and second reflection means, or the first and second reflection means may be mounted on separate support means.

Alternatively, the support means may be a second, inner crucible containing molten material in fluid communication with the molten material in the first crucible, such that the first and second reflection means are supported on the inner crucible and the inner crucible floats on the molten material in the first crucible. This arrangement has all the advantages of a conventional double crucible apparatus, and also provides the further advantage that an image of the crystal or any other part of the growth interface region, obtained by viewing output radiation reflected from the second reflection means, remains fixed in the field of view independently of the fall in depth of the molten material as the crystal grows.

The first and second reflection means may be arranged such that input radiation reflected from the first reflection means is reflected to the second reflection means via the surface of the molten material.

The apparatus may also comprise image processing means for receiving output radiation and for forming an image of the crystal or any part of the growth interface region. The apparatus may further comprise means for heating the contents of the first crucible.

Preferably, the input and output paths make an angle of less than 5° to the vertical and the input and output paths are in a substantially vertical direction.

The first and second reflection means may be plane mirrors. The apparatus may also comprise a source of radiation for directing radiation along the input path. The apparatus may also comprise one or more mirror for directing radiation from a source along the input path. This provides the advantage that the source may be located in a more convenient location. The apparatus may also comprise one or more mirror for reflecting radiation reflected from the second reflection means towards image processing means.

The apparatus may also comprise means for determining at least one of a crystal diameter measurement or a meniscus region diameter measurement from the observed image. The apparatus may also comprise feedback means for controlling crystal growth in response to the measured crystal diameter or the measured meniscus region diameter.

The first reflection means may be marked with a measurement scale to provide sealing for crystal diameter measurement or meniscus region diameter measurement. Alternatively, the apparatus may comprise means for reflecting a measurement scale in the first reflection means to provide sealing for crystal diameter measurement or meniscus region diameter measurement.

According to another aspect of the invention, a crucible for use in growing crystals from a molten material in which the crucible floats on molten material within an outer crucible is characterised in that it comprises first reflection means for receiving radiation and reflecting radiation across a growth interface region and second reflection means for receiving radiation reflected across the growth interface region and reflecting output radiation, wherein the first and second reflection means are arranged such that during crystal growth they are at or in close proximity with the surface of the molten material such that they maintain a substantially constant position relative to the surface of the molten material during crystal growth.

The crucible may comprise first and second reflective surfaces which may be an integral part of the crucible, e.g. polished surfaces or may be mounted on the crucible.

According to another aspect of the invention, a method of growing crystals comprises the steps of;

(i) heating a molten material from which the crystal is to be grown with heating means, the molten material and the crystal having a meniscus region therebetween, (ii) directing radiation along an input path towards first reflection means for reflection across a growth interface region to second reflection means, (iii) receiving radiation reflected from the first reflection means at the second reflection means and reflecting output radiation along an output path, and (iv) arranging the first and second reflection means at or in close proximity with the surface of the molten material such that during crystal growth they maintain a substantially constant position relative to the surface of the molten material.

The method may comprise the step of supporting the first and second reflection means on support means arranged to float on the molten material such that during crystal growth the first and second reflection means maintain a substantially constant position relative to the surface of the molten material.

The method may also comprise the step of obtaining an image of the crystal or any part of the growth interface region using image processing means. The method may also comprise the further step of determining at least one of a crystal diameter measurement or a meniscus region diameter measurement from image processing means and controlling crystal growth in response to the measured crystal diameter or the measured meniscus region diameter.

BRIEF DESCRIPTION OF THE DRAWINGS

The invention will now be described, by example only, with reference to the following figures in which.

DETAILED DISCUSSION OF EMBODIMENTS

Figure 1:
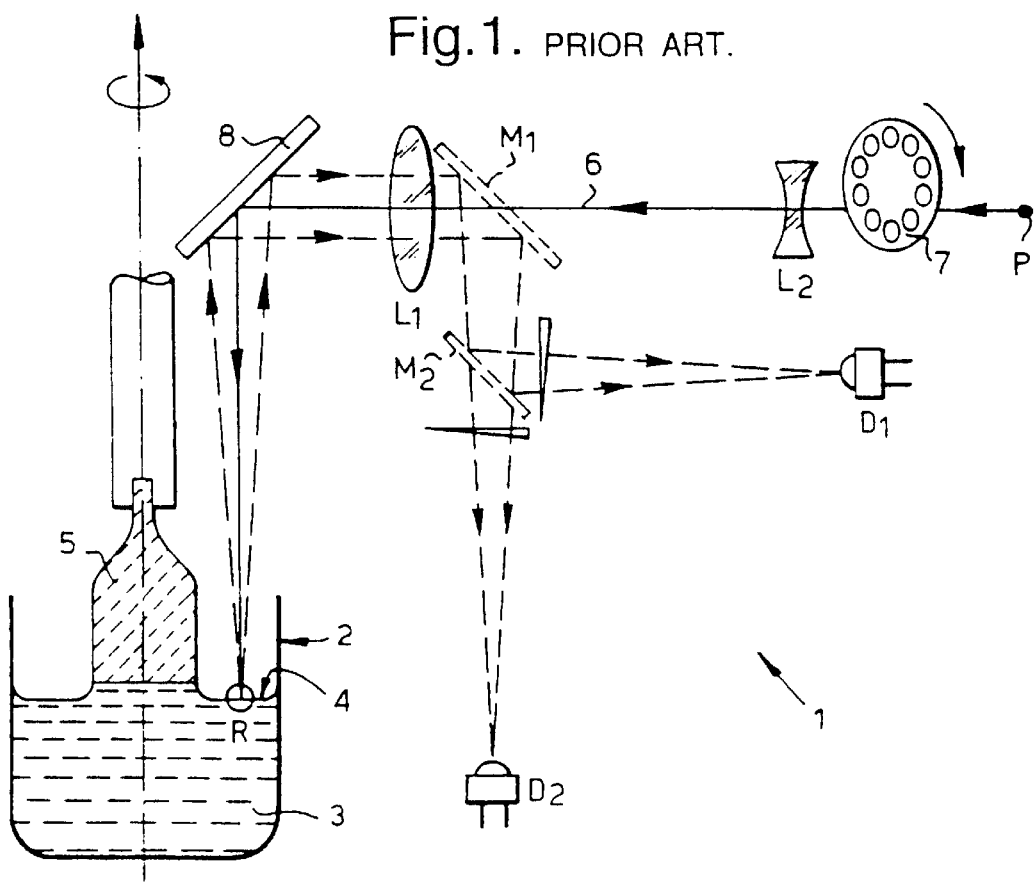
FIG. 1 shows apparatus known in the prior art for optical crystal diameter measurement.

With reference to FIG. 1, there is shown schematically a known optical measurement apparatus for measuring crystal diameter during growth, using conventional Czochralski growth techniques. The apparatus, referred to generally as 1, comprises a crucible 2, containing a molten material (melt) 3, having a melt surface 4, which after heating and cooling will solidify to form a crystal 5 of the desired composition. In this scheme, the diameter of the crystal 5 is measured by observing the reflection of an input laser beam 6, from a point source P, from the melt surface 4.

Figure 2:
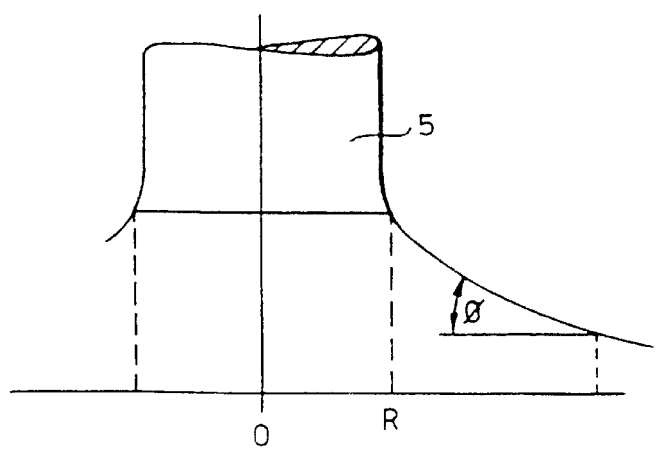
FIG. 2 shows a diagram of the melt surface interface in more detail.

The radiation beam 6 is input through a chopper 7, for periodically varying the input signal, is focussed through lenses $L_1$ and $L_2$ and is reflected from mirror 8 towards the melt surface 4. Radiation reflected from the melt surface at R is focussed by lens $L_1$ and reflected onto photodiode detectors $D_1$ and $D_2$ by mirrors $M_1$ and $M_2$. The distribution ratio of the intensity at the photodiodes is dependent on the reflection angle and by measuring the reflection angle of the beam from the melt surface 4, the surface inclination angle, $\phi$, can be determined (see FIG. 2). It has been shown that the surface inclination angle is a true measure of the crystal diameter at the solid-liquid interface [e.g. H. J. A. van Dijk et al., Acta Electronica, 17, 1, 1974 pp 45–55]. Hence, measuring the reflection angle gives a measure of the crystal diameter.

However, this method does suffer from several disadvantages. For example, the apparent diameter of the crystal is affected by changes of depth due to the falling melt level as the crystal grows and the melt is depleted. Also, if the crystal diameter is reduced sufficiently suddenly, the meniscus disappears from view and measurement and control are lost. In the case of a liquid encapsulated melt, as is required for some material, reflections of the light beam from the encapsulant and its meniscus can cause confusion.

In other methods also (e.g. Gartner et al. *Journal of Crystal Growth* 13/14 619–623 (1972)), the change in melt depth due to the falling melt level as the crystal grows is also a problem as the image of the crystal moves in the cameras view. Either the mirror employed in this method or the camera must therefore be moved to compensate.

It is an object of the present invention to provide a crystal growth apparatus and method to enable viewing of a crystal during growth in which the position of the image of the crystal is independent of the falling melt depth and does not therefore require external compensation means. The apparatus may easily be arranged for use with conventional apparatus for Czochralski growth. The apparatus may be particularly applicable to double crucible techniques for crystal growth. Details of such systems may be found in Journal of Applied Physics, 29, no. 8 (1958) pp 1241–1244, U.S. Pat. No. 5,047,112 and BG patent application 9412629.9.

Figure 3:
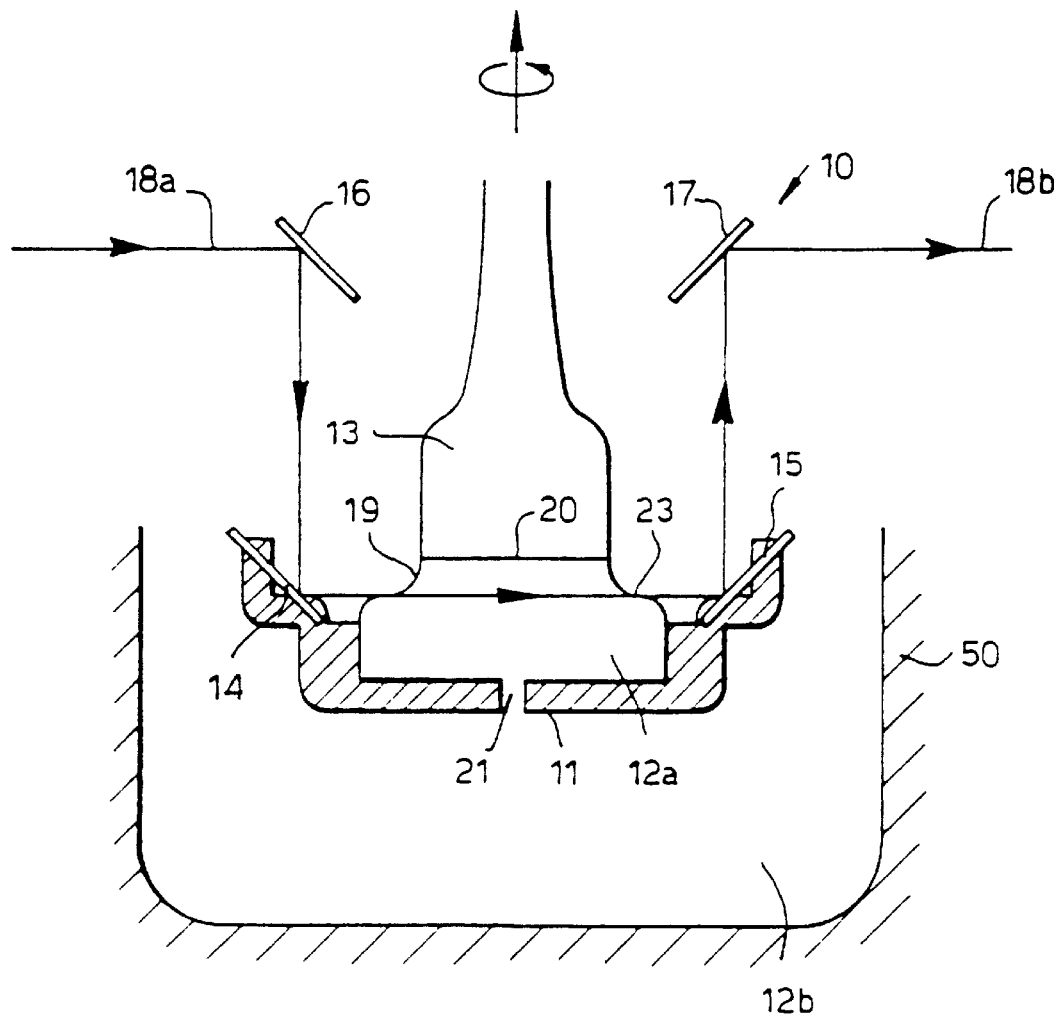
FIG. 3 shows a schematic diagram of one embodiment of the apparatus of the present invention.

FIG. 3 shows a double crucible embodiment of the apparatus of the present invention, the apparatus is referred to generally as 10. The apparatus typically comprises an inner crucible 11, containing a material which, after heating to form a melt 12, will solidify to form a crystals 1 of the desired composition. The apparatus 10 also includes two mirrors 14, 15 supported on the crucible 11 at, or in close proximity with, the level of the melt surface. Two further mirrors 16, 17 may also be included and are supported externally of the crucible 11. The apparatus also comprises an outer crucible 50.

The apparatus is particularly applicable to the double crucible method which is designed to permit crystal growth of crystals where slow growth is essential to avoid growth defects, such as arise from constitutional cooling. Conventional double crucible systems for crystal growth are described in the aforementioned reference. The inner crucible 11 is located within an outer crucible 50. The crystal 13 is drawn from the melt 12a in the inner crucible which, under equilibrium conditions, has the same composition as a melt 12b in the outer crucible. The melt in the inner crucible 11 is replenished from the outer crucible 50 via a channel 21.

Figure 5:
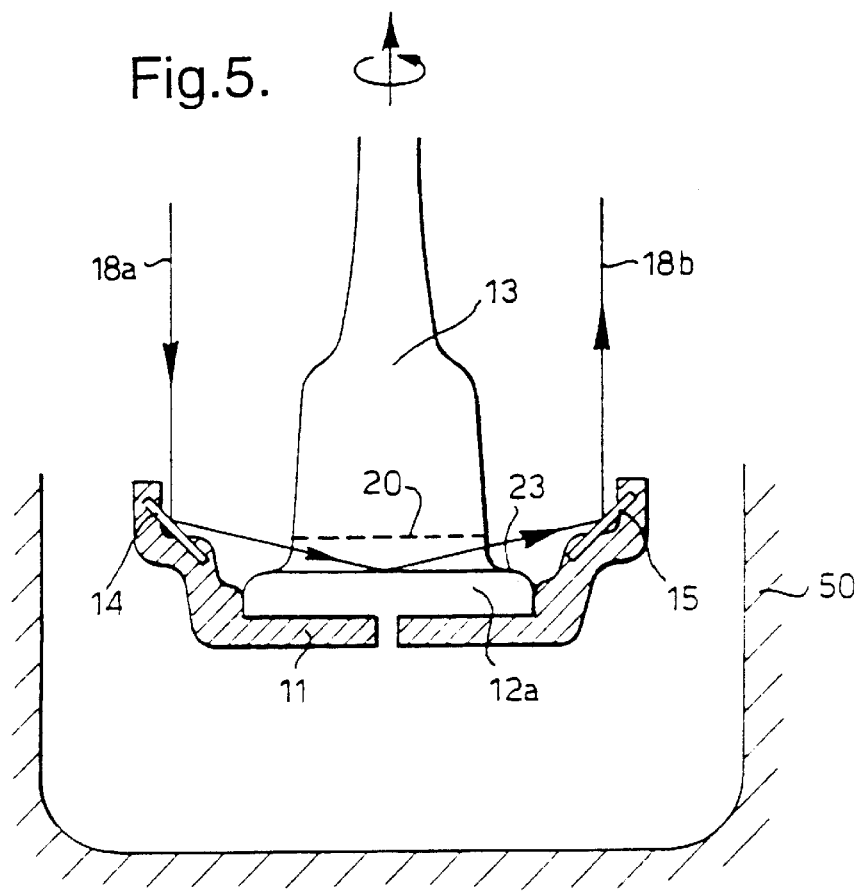
FIG. 5 shows an alternative arrangement of part of the apparatus shown in FIG. 4.

An enlarged schematic image of the growth interface region is shown in FIG. 5. This shows the crystal 13, the growth interface 20 (i.e. the melt/crystal interface), the meniscus 19 formed between the melt and the growing crystal and the melt surface 23, as well as the part of the growing crystal 13 closest to the growth interface. For the purpose of this specification, the "growth interface region" shall be taken to mean the region comprising the growth interface 20, the meniscus 19, the melt surface 23 and the growing crystal in the region of the growth interface 20.

Incoming radiation 18 from a source (not shown) is directed towards the mirror 16 where it is reflected towards mirror 14. Mirrors 16 and 14 are arranged so that radiation is reflected from mirror 16 to mirror 14 in a substantially vertical direction. In the embodiment shown in FIG. 4, mirrors 14 and 15 are arranged so that the path of radiation reflected between them traverses the melt at its surface 23. Mirror 17 is arranged relative to mirror 15 such that radiation is reflected substantially vertically upwards from mirror 15, with mirror 7 angled such that output radiation 18b is reflected away from the apparatus to a location convenient for visualisation. Output radiation 18b is then input to image processing means (not shown). The image processing means may be the human eye, viewing the crystal directly through a telescope. However, in practice, it will be preferable to view the crystal with a camera. The image obtained by the camera may then be analysed in software, as will be described in further detail later.

During crystal growth the level of the melt 12a within the crucible 11 depletes. The level of the melt 12b in the outer crucible 50 therefore drops as the crystal grows, and the vertical height of the inner crucible 11 falls with the falling melt depth. An important feature of the present invention is that the position of the meniscus image is independent of this falling melt depth (i.e. the melt in the outer crucible). This occurs because the mirrors 14, 15 are supported within the inner crucible 11 which is floating on the melt in the outer crucible 50. This is advantageous as the position of the meniscus image therefore remains fixed in the field of view.

This facilitates capture for image processing. This is not the case in conventional optical measurement methods, where additional means are required to compensate for this drop in melt depth.

Figure 4:
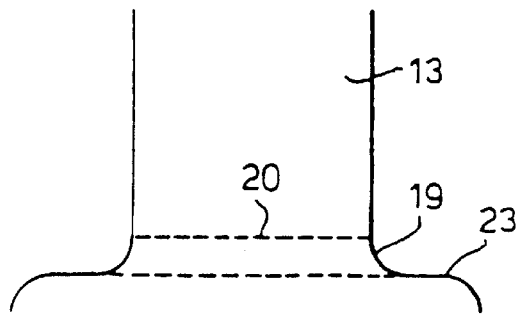
FIG. 4 shows a schematic image of the growth meniscus.
Figure 6:
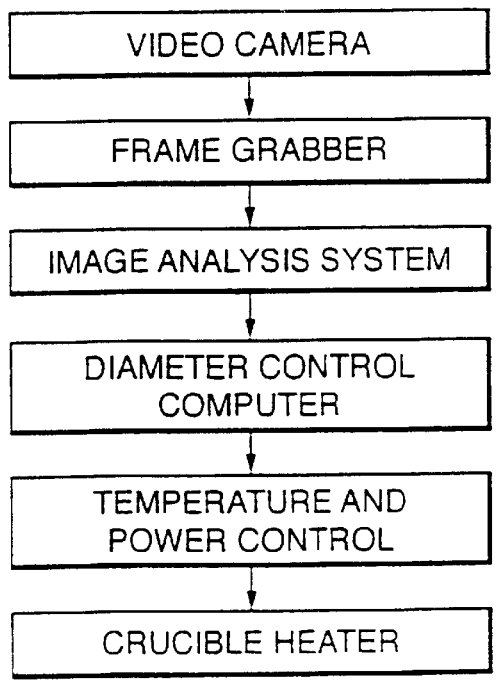
FIG. 6 shows a flow diagram of the control feedback process.

In the embodiment of the double crucible apparatus shown in FIG. 4, the mirrors 14, 15 are located at the surface of the melt 23. In an alternative embodiment of a double crucible apparatus of the invention, rather than being located at the surface of the melt 23, the mirrors 14, 15 may be arranged in close proximity with the melt surface 23. An example of such an arrangement is illustrated in FIG. 6. In this arrangement, the mirrors 14, 15 may be supported on the inner crucible 11. The mirrors 14, 15 are angled such that incoming radiation reflects from mirror 14 onto the melt surface 23 where it is reflected towards mirror 15. In this arrangement also, the position of the mirrors 14, 15 relative to the melt surface 23 remains substantially constant so that the position of the image of the meniscus is independent of the falling melt depth.

The method is independent of falling melt depth only if the angle of deviation of the light path radiation from the vertical between mirror pairs 16/14 and 15/17 is small. For an angle of deviation, $\theta$, the error in the measurement will be proportional to $\tan^2\theta$ which is negligible for angles of $\theta > 5°$.

In an alternative embodiment, the crucible may have no channel and be used in a single crucible system for conventional Czochralski growth. In this embodiment, the mirrors may be located on a support which floats on the melt surface. The support may be an integral part of the mirrors, for example the substrate on which the reflective coating f the mirror is applied. The support means may be any support, such as a collar, which may is separately manufactured and on which the mirrors 14, 15 may be mounted so as to float on the melt.

The mirror 14 may have a graduated measurement scale marked on its reflective surface. This may be used to provide an accurate measurement of the crystal diameter, or may be used to adjust the image acquisition hardware (e.g. camera lens) to automatically or manually optimise the focal length of a zoom lens, thus ensuring magnification of the image is as high as possible without exceeding the available aperture. This ensures maximum resolution and accuracy of control, and is particularly useful during the normally difficult seeding stage of growth. Alternatively, a graduated measurement scale may be reflected into the mirror 14, rather than marking the scale on the mirror.

The upper mirrors 16, 17 shown in FIG. 3 are not essential. In an alternative embodiment, the mirrors 16, 17 may be replaced with a light source, placed at mirror position 16, and detection means placed at mirror position 17 (or vice versa depending on the preferred viewing location). Again, the position of the meniscus image is independent of the falling melt height for small angles of deviation, $\theta$, which can be achieved by suitable positioning of the light source and detection means.

In conventional optical measurement schemes, sudden reduction in crystal diameter can cause the meniscus to disappear from the field of view under the growing crystal and measurement and control are lost. Using the present invention, the meniscus is not obscured after reduction of the crystal diameter and this problem is avoided.

The invention also has advantages over conventional weighing techniques used to measure and automatically control crystal diameter during growth. In such methods, control signals of the opposite direction to that required can be obtained inadvertently due to properties of the growing crystal material. In particular, this is a problem for group III–V semiconductor materials, such as InSb. The measurement process of the present invention removes this problem and can be applied universally to any material for which the Czochralski process is suitable. The technique can also be applied to encapsulated melts with no adverse effects due to the encapsulant, unlike in conventional techniques where reflections from the encapsulant can cause problems.

Furthermore, conventional weighing techniques rely on measurement of the rate of weight change. Therefore, if the crystal is not growing the technique cannot be used to measure crystal diameter. An advantage of the present invention is that the crystal diameter can be measured directly if the crystal is not growing. This is particularly useful during the seeding stage of growth and may be used to enable automatic growth from the normally difficult seed dipping stage.

The improved view of the growing crystal and its meniscus permits much earlier manual growth control, particularly during the normal difficult seeding stage of growth. As a silhouette, or shadowgraph, image is obtained this enables easier distinction in subsequent image processing between the crystal and the background in the image. This means the crystal diameter may be measured more accurately. A high degree of accuracy is important for any feedback control process for automatically controlling of the growth process.

During growth, an image of the growing crystal or any part of the growth interface region may be captured using a conventional video camera and frame grabber. This image may then be analysed, using conventional commercially available processes which provide a linear measurement of particular features in the image. By selecting a part of the image which is representative of the crystal diameter, or of the meniscus diameter immediately below the growing crystal, the effective diameter of the growing crystal may be determined.

The value obtained may be used to determine any deviation or error used in a control feedback process to correspondingly adjust the temperature of the melt, the power supplied to the crucible heater, or the crystal withdrawal rate, to alter the growth rate as appropriate to achieve the desired crystal. FIG. 6 shows a flow diagram of the steps in a typical automatic feedback control process which may form part of the invention, from image capture to temperature control.

The method of the present invention, for measuring and controlling crystal diameter during growth, can be applied to any conventional Czochralski growth techniques or double crucible techniques.

What is claimed is:

1. A crystal growth apparatus comprising;
    a crucible for containing a supply of molten material from which a crystal is grown, the molten material and the crystal having a meniscus region therebetween,
    first reflection means for receiving radiation directed along an input path and reflecting radiation across a growth interface region and
    second reflection means for receiving radiation reflected across the growth interface region and reflecting output radiation along an output path,
    wherein the first and second reflection means are arranged at or in close proximity with the surface of the molten material such that during crystal growth they maintain a substantially constant position relative to the surface of the molten material.

2. The apparatus of claim 1, and further comprising support means for supporting the first and second reflection means, whereby the support means are arranged to float on the molten material such that during crystal growth the first and second reflection means maintain a substantially constant position relative to the surface of the molten material.

3. The apparatus of claim 2, wherein the support means are a second, inner crucible containing molten material in fluid communication with the molten material in the first crucible, such that the first and second reflection means are supported on the inner crucible and the inner crucible floats on the molten material in the first crucible.

4. The apparatus of claim 2, wherein the support means are integral with the first and second reflection means.

5. The apparatus of claim 1 wherein the first and second reflection means are arranged such that input radiation reflected from the first reflection means to the second reflection means is reflected across the growth interface region via the surface of the molten material.

6. The apparatus of claim 1, and further comprising image processing means for receiving output radiation and for forming an image of the crystal or any part of the growth interface region.

7. The apparatus of claim 1, and further comprising means for heating the contents of the first crucible.

8. The apparatus of claim 1, wherein the input and output paths make an angle of less than 5° to the vertical.

9. The apparatus of claim 1, wherein the input and output paths are in a substantially vertical direction.

10. The apparatus of claim 1, wherein the first and second reflection means are plane mirrors.

11. The apparatus of claim 1, comprising a source of radiation for directing radiation along the input path.

12. The apparatus of claim 1, comprising a source of radiation and one or more mirror for directing radiation along the input path.

13. The apparatus of claim 1, and further comprising one or more mirror for reflecting radiation reflected from the second reflection means towards image processing means.

14. The apparatus of claim 13, and further comprising means for determining at least one of a crystal diameter measurement or a meniscus region diameter measurement from an observed image.

15. The apparatus of claim 14, and also comprising feedback means for controlling crystal growth in response to crystal diameter measurement or meniscus region diameter measurement.

16. The apparatus of claim 1 wherein the first reflection means is marked with a measurement scale to provide scaling for crystal diameter measurement or meniscus region diameter measurement.

17. The apparatus of claim 1, and further comprising means for reflecting a measurement scale in the first reflection means to provide scaling for crystal diameter measurement or meniscus region diameter measurement.

18. A crucible for use in growing crystals from a molten material in which the crucible floats on molten material within an outer crucible, characterised in that the crucible comprises first reflection means for receiving radiation and reflecting radiation across a growth interface region and second reflection means for receiving radiation reflected across the growth interface region and reflecting output radiation, wherein the first and second reflection means are arranged such that during crystal growth they are at or in close proximity with the surface of the molten material such that they maintain a substantially constant position relative to the surface of the molten material during crystal growth.

19. The crucible of claim 18 comprising first and second reflective surfaces which are an integral part of the crucible.

20. The crucible of claim 18 comprising first and second reflective surfaces mounted on the crucible.

21. A method of growing crystals comprising the steps of;
(i) heating a molten material from which the crystal is to be grown with heating means, the molten material and the crystal having a meniscus region therebetween,
(ii) directing radiation along an input path towards first reflection means for reflection across a growth interface region to second reflection means,
(iii) receiving radiation reflected from the first reflection means to the second reflection means and reflecting output radiation along an output path, and
(iv) arranging the first and second reflection means at or in close proximity with the surface of the molten material such that during crystal growth they maintain a substantially constant position relative to the surface of the molten material.

22. The method of claim 21, comprising the step of supporting the first and second reflection means on support means arranged to float on the molten material such that during crystal growth the first and second reflection means maintain a substantially constant position relative to the surface of the molten material.

23. The method of claim 21, and further comprising the step of obtaining an image of the crystal or any part of the growth interface region using image processing means.

24. The method of claim 23, and further comprising the step of determining at least one of a crystal diameter measurement or a meniscus region diameter measurement from image processing means and controlling crystal growth in response to the measured crystal diameter or the meniscus region diameter.

* * * * *